United States Patent
Nakamura et al.

(10) Patent No.: US 8,058,554 B2
(45) Date of Patent: Nov. 15, 2011

(54) SEMICONDUCTOR POWER CONVERSION APPARATUS AND METHOD OF MANUFACTURING THE SAME

(75) Inventors: Hideo Nakamura, Toyota (JP); Tomoyuki Watanabe, Toyota (JP); Hirotaka Ohno, Nishikamo-gun (JP); Nobuaki Inagaki, Seto (JP)

(73) Assignee: Toyota Jidosha Kabushiki Kaisha, Aichi-Ken (JP)

( * ) Notice: Subject to any disclaimer, the term of this patent is extended or adjusted under 35 U.S.C. 154(b) by 286 days.

(21) Appl. No.: 12/526,854

(22) PCT Filed: Feb. 20, 2008

(86) PCT No.: PCT/JP2008/053348
§ 371 (c)(1),
(2), (4) Date: Aug. 12, 2009

(87) PCT Pub. No.: WO2008/102914
PCT Pub. Date: Aug. 28, 2008

(65) Prior Publication Data
US 2010/0089607 A1    Apr. 15, 2010

(30) Foreign Application Priority Data
Feb. 22, 2007  (JP) .................................. 2007-042205

(51) Int. Cl.
*H02G 5/00*    (2006.01)
(52) U.S. Cl. ....................................... 174/68.2; 257/691
(58) Field of Classification Search ................. 174/68.2, 174/71 B, 72 B, 70 B; 257/691
See application file for complete search history.

(56) References Cited

U.S. PATENT DOCUMENTS

| | | | |
|---|---|---|---|
| 5,831,835 A | 11/1998 | Dirmeyer et al. | |
| 6,545,343 B2 * | 4/2003 | Brooks et al. | 257/666 |
| 6,552,273 B2 | 4/2003 | Nishida | |
| 6,671,169 B1 * | 12/2003 | Drabon | 361/648 |
| 6,693,370 B2 * | 2/2004 | Yamane et al. | 307/10.1 |
| 6,861,734 B2 | 3/2005 | Minamio et al. | |
| 6,870,253 B1 * | 3/2005 | Ushijima | 257/691 |
| 6,906,404 B2 * | 6/2005 | Maly et al. | 257/678 |

(Continued)

FOREIGN PATENT DOCUMENTS
DE    4430798 A1    3/1996
(Continued)

OTHER PUBLICATIONS

Japanese Office Action for corresponding Japanese Patent Application No. 2007-042205 mailed Oct. 26, 2010.

(Continued)

*Primary Examiner* — Hung Ngo
(74) *Attorney, Agent, or Firm* — Sughrue Mion, PLLC

(57) ABSTRACT

A bus bar has a lead portion and a bus bar portion which are integrally shaped. The lead portion is provided in such a shape that branches from the bus bar portion. A part of the lead portion forms a connection part directly electrically connected with a transistor electrode and a diode electrode by a connecting material such as solder. The thickness of the lead portion including the connection part is made smaller than the thickness of the bus bar portion. Accordingly, such an interconnection structure can be provided in which the electrode of the semiconductor device and the bus bar are electrically directly connected with each other and thermal stress at the connection part therebetween can be relieved.

16 Claims, 8 Drawing Sheets

U.S. PATENT DOCUMENTS

| | | | |
|---|---|---|---|
| 6,992,409 B2 | 1/2006 | Torii et al. | |
| 7,053,302 B2 * | 5/2006 | Bjorklund et al. | 174/68.2 |
| 7,192,290 B2 * | 3/2007 | Ochiai et al. | 439/135 |
| 2003/0151128 A1 * | 8/2003 | Kawaguchi | 257/691 |
| 2003/0168726 A1 * | 9/2003 | Ishii et al. | 257/691 |
| 2004/0022041 A1 | 2/2004 | Bergmann et al. | |
| 2006/0071860 A1 | 4/2006 | Hozoji et al. | |
| 2006/0138633 A1 | 6/2006 | Naruse et al. | |
| 2006/0192509 A1 | 8/2006 | Nakakita et al. | |
| 2009/0200864 A1 * | 8/2009 | Maier | 307/9.1 |

FOREIGN PATENT DOCUMENTS

| | | |
|---|---|---|
| DE | 19531496 C1 | 11/1996 |
| DE | 10220047 A1 | 11/2003 |
| JP | 3155319 A | 7/1991 |
| JP | 06-104381 A | 4/1994 |
| JP | 11-004584 A | 1/1999 |
| JP | 2000-124398 A | 4/2000 |
| JP | 2002-017092 A | 1/2002 |
| JP | 2003-303939 A | 10/2003 |
| JP | 2004-040877 A | 2/2004 |
| JP | 2004-364427 A | 12/2004 |
| JP | 2005-197340 A | 7/2005 |
| JP | 2005-261035 A | 9/2005 |
| JP | 2006-074918 A | 3/2006 |
| JP | 2006-109576 A | 4/2006 |
| JP | 2006-140390 A | 6/2006 |
| JP | 2006-186170 A | 7/2006 |
| JP | 2006-238651 A | 9/2006 |
| JP | 2006-262664 A | 9/2006 |

OTHER PUBLICATIONS

German Office Action dated Jul. 25, 2011, issued in corresponding German Patent Application No. 11 2008 000 466.8.

* cited by examiner

SEMICONDUCTOR POWER CONVERSION APPARATUS AND METHOD OF MANUFACTURING THE SAME

TECHNICAL FIELD

The present invention relates to a semiconductor power conversion apparatus and a method of manufacturing the same, and more particularly to a semiconductor power conversion apparatus having a structure in which a bus bar and a semiconductor device are directly connected with each other, and a method of manufacturing the same.

BACKGROUND ART

In a power conversion apparatus such as an inverter integrated into a motor, the electrodes of semiconductor devices included in the power conversion apparatus are electrically connected with other circuit components using a bus bar, as disclosed in Japanese Patent Laying-Open Nos. 2006-262664, 2004-364427, 2004-040877, 2005-261035, and 2006-074918.

In particular, Japanese Patent Laying-Open No. 2006-262664 discloses a power conversion apparatus suitable for motor drive of a hybrid vehicle, in which the top and bottom surfaces of such a structure as an inverter including semiconductor devices and bus bars are laminated with insulating films so that a plurality of semiconductor devices and circuits are collectively insulated. In particular, in a structure disclosed in Japanese Patent Laying-Open No. 2006-262664, electrodes of semiconductor devices and bus bars are directly connected with each other without bonding wire. Japanese Patent Laying-Open No. 2004-364427 discloses that bus bars are connected to both surfaces of a semiconductor device in order to establish electrical connection.

However, in the structure in which an electrode of a semiconductor device and a bus bar are directly connected with each other as disclosed in Japanese Patent Laying-Open Nos. 2006-262664 and 2004-364427, the bus bar is thermally expanded due to a temperature rise resulting from current passing or heat from the semiconductor device, so that thermal stress acts on a connection portion. Considering that a temperature rise is relatively large in an inverter having a bus bar connected to a plurality of semiconductor devices and that size reduction is demanded for a high-power, power conversion apparatus typically applied to a vehicle, such an interconnection structure is requested that can stably secure electrical connection between an electrode of a semiconductor device and a bus bar even at a temperature rise.

DISCLOSURE OF THE INVENTION

The present invention is made in order to solve such a problem. An object of the present invention is to provide a semiconductor power conversion apparatus having an interconnection structure that electrically directly connects an electrode of a semiconductor device and a bus bar with each other and can connect them stably even at a temperature rise, and a method of manufacturing the same.

A semiconductor power conversion apparatus in accordance with the present invention includes a semiconductor device for performing power conversion and a bus bar for electrically connecting an electrode of the semiconductor device and a circuit component external to the semiconductor device with each other. The bus bar is configured to include a connection section with the electrode and a non-connection section with the electrode that are integrally shaped and to have a thermal stress relief mechanism for relieving thermal stress acting on a connection part with the electrode formed of a part of the connection section.

According to the semiconductor power conversion apparatus described above, the integrally shaped bus bar allows the electrode of the semiconductor device and the bus bar to be electrically directly connected with each other. In addition, the amount of thermal expansion of the bus bar at the connection part can be reduced and therefore the thermal stress acting on the connection part can be relieved, so that the bus bar and the electrode can be connected stably even at a temperature rise.

Preferably, the connection section is formed such that at least the thickness of the connection part is smaller than that of the non-connection section, thereby forming the thermal stress relief mechanism.

Because of such a configuration, the amount of thermal expansion of the connection part with the electrode at a temperature rise is reduced, so that the thermal stress acting on the connection part can be reduced.

Preferably, the connection section has a part shaped to be displaceable in response to thermal stress acting on the connection part, as the thermal stress relief mechanism, in at least a part of a non-connection part with the electrode.

Because of such a configuration, the thermal stress acting on the connection part with the electrode can be released by displacement of the connection section at a temperature rise, so that the thermal stress acting on the connection part can be relieved.

Alternatively, preferably, the connection section has a part having a shape thinner than a thickness of the non-connection section and shaped to be displaceable in response to thermal stress acting on the connection part, in at least a part of a non-connection part with the electrode, thereby forming the thermal stress relief mechanism.

Because of such a configuration, the amount of thermal expansion of the connection part with the electrode at a temperature rise can be reduced, and in addition, the thermal stress acting on the connection part with the electrode can be released by displacement of the connection part, so that the thermal stress acting on the connection part can be relieved.

Preferably, the non-connection section has an electrical connection portion with the circuit component, and the connection section is shaped to branch from the non-connection section.

Therefore, the above-noted bus bar can be realized without complicating the shape.

Further preferably, the semiconductor power conversion apparatus further includes a fixed post for attaching the non-connection section and a circuit board mounted on the fixed post with the non-connection section interposed. The fixed post is formed of an insulating material. The non-connection section has a protrusion portion provided integrally with the non-connection section on that surface opposite to a surface having the fixed post attached thereon. The circuit board has a mounting hole having the protrusion portion fitted therein and a conductive portion. The conductive portion is configured such that electrical connection is established between the non-connection section and a circuit component on the circuit board by connecting the protrusion portion to the mounting hole.

According to the semiconductor power conversion apparatus as described above, provision of the protrusion portion on the bus bar facilitates alignment in the operation of mounting the circuit board, thereby improving the operability. As a result, throughput per unit time can be increased, so that the manufacturing costs can be reduced.

Alternatively, preferably, the bus bar includes first and second protection coats. The first protection coat is formed by covering a surface of a non-connection part with the electrode with an insulating material. The second protection coat is formed by heat-curing an insulating material coated on a surface of the connection part with the electrode in a state of being connected with the electrode.

Further preferably, the bus bar further includes a protection coat formed by heat-curing an insulating material coated on the surfaces of the connection section and the non-connection section in a state of being connected with the electrode.

According to the semiconductor power conversion apparatus described above, the volume that requires insulating protection for the semiconductor device and the connection part of the bus bar is reduced by avoiding the use of wire bonding. Accordingly, while the amount of insulating material for use is reduced, the connection part can be protected properly in view of both strength and insulation.

Preferably, the semiconductor device is configured such that current between first and second current electrodes is controlled according to a potential or current of a control electrode. The bus bar then electrically connects the control electrode with the circuit component. Alternatively, the bus bar electrically connects one of the first and second current electrodes with the circuit component.

According to the semiconductor power conversion apparatus described above, the thermal stress of the connection part is reduced and a disconnection failure is prevented for both the control electrode (typically, gate) and the current electrode (typically, collector and emitter) of a semiconductor device. In addition, the electrode of the semiconductor device and the bus bar can electrically directly be connected with each other without bonding wire.

Preferably, the bus bar is electrically connected with electrodes of a plurality of the semiconductor devices in common.

According to the semiconductor power conversion apparatus described above, the thermal stress of the connection part is reduced and a disconnection failure is prevented for the bus bar connected to a plurality of semiconductor devices and having its temperature easily increased. In addition, the electrode of the semiconductor device and the bus bar can electrically directly be connected with each other without bonding wire.

A method of manufacturing a semiconductor power conversion apparatus in accordance with the present invention includes first and second processes. In the first process, a bus bar is electrically connected with an electrode of a semiconductor device. The bus bar is configured to include a connection section with the electrode of the semiconductor device and a non-connection section with the electrode that are integrally shaped, and the connection section has a thermal stress relief mechanism for relieving thermal stress acting on a connection part with the electrode. In the second process, an insulating protection coat is formed at least for the connection part of the bus bar with the electrode formed through the first process.

According to the method of manufacturing a semiconductor power conversion apparatus described above, the integrally shaped bus bar allows the electrode of the semiconductor device and the bus bar to be electrically directly connected with each other. In addition, the amount of thermal expansion of the bus bar at the connection part can be reduced and therefore the thermal stress acting on the connection part can be relieved. As a result, a disconnection failure between the semiconductor device and the bus bar can be prevented.

Further preferably, prior to the first process, a protection coat is provided which is formed by covering with an insulating material a surface of a non-connection part with the electrode of the bus bar. The second process includes a first sub-process of coating with an insulating material a surface of the connection part with the electrode in a state of being connected with the electrode, and a second sub-process of forming the insulating protection coat by heat-curing a coating formed through the first sub-process. Further preferably, in the first sub-process, the surface of the connection part is coated with an insulating material by spraying a sol-like insulating resin.

Preferably, the second process includes a first sub-process of charging a gel-like insulating material for soaking the semiconductor device and the bus bar, a second sub-process of exhausting and recovering the insulating material so that a coating of the insulating material is left on the surfaces of the connection section and the non-connection section of the bus bar, and a third sub-process of heat-curing the coating of the insulating material formed through the second sub-process thereby forming the insulating protection coat.

According to the method of manufacturing a semiconductor power conversion apparatus as described above, the volume that requires insulating protection for the semiconductor device and the connection part of the bus bar is reduced. As a result, while the amount of insulating material for use is reduced, the connection part can be protected properly in view of strength and insulation.

Alternatively, preferably, in the first process, the non-connection section is attached to a fixed post formed of an insulating material. The method of manufacturing a semiconductor power conversion apparatus further includes a third process of mounting a circuit board on the fixed post with the non-connection section interposed. Then, the third process includes first and second sub-processes. In the first sub-process, a protrusion portion provided integrally with the non-connection section on that surface opposite to a surface of the non-connection section having the fixed post attached thereon is fitted into a mounting hole provided in the circuit board. In the second sub-process, the protrusion portion is connected with a conductive portion provided on a side surface of the mounting hole and electrically connected to a circuit component on the circuit board, whereby the conductive portion and the protrusion portion are electrically connected with each other.

According to the method of manufacturing a semiconductor power conversion apparatus as described above, alignment at a time of mounting a circuit board becomes easy and the operability of the third process is improved. As a result, throughput per unit time can be increased, so that the manufacturing costs can be reduced.

Therefore, according to a semiconductor power conversion apparatus and a method of manufacturing the same in accordance with the present invention, an electrode of a semiconductor device and a bus bar can electrically directly be connected with each other, and in addition, they can be connected stably even at a temperature rise,

BEST MODES FOR CARRYING OUT THE INVENTION

Figure 1:
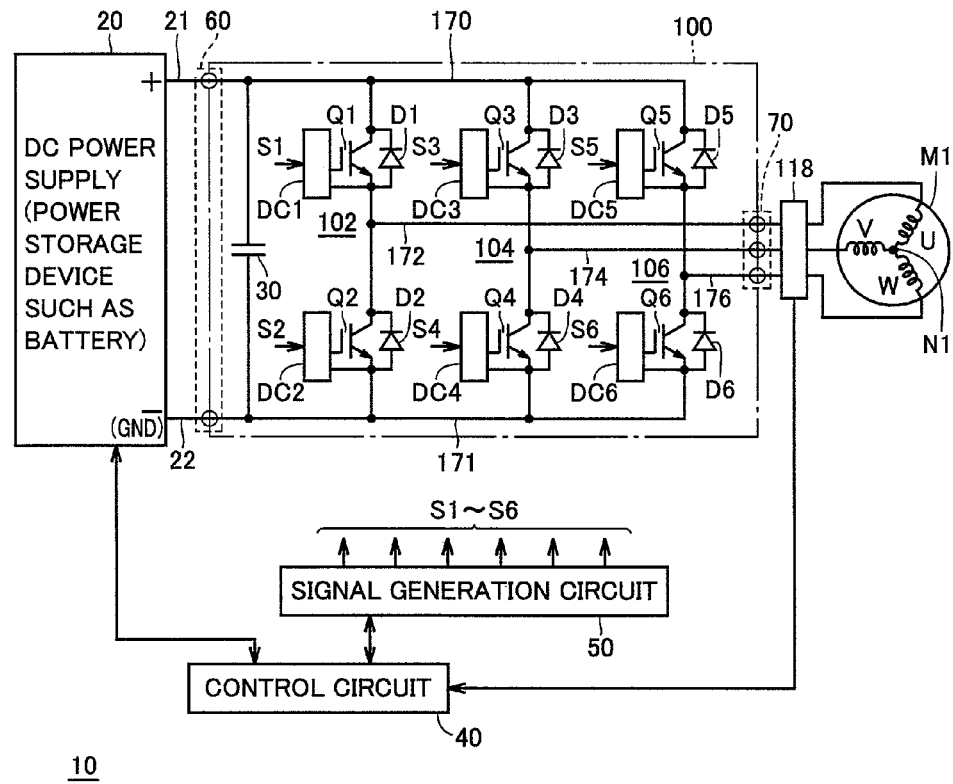
FIG. 1 is an electrical circuit diagram illustrating an exemplary configuration of a semiconductor power conversion apparatus in accordance with an embodiment of the present invention.

In the following, an embodiment of the present invention will be described in detail with reference to the drawings. It is noted that the same or corresponding parts in the figures are denoted with the same reference characters and a description thereof will not basically be repeated.

FIG. 1 is an electrical circuit diagram illustrating an exemplary configuration of a semiconductor power conversion apparatus in accordance with an embodiment of the present invention.

Referring to FIG. 1, an inverter 100 shown as a typical example of a semiconductor power conversion apparatus in accordance with an embodiment of the present invention is a power conversion apparatus performing electric power conversion between DC voltage of a DC power supply 20 and AC voltage of each phase of a rotating electric machine M1. A smoothing capacitor 30 for removing a ripple component of DC voltage is connected to the DC voltage side of inverter 100.

DC power supply 20 is formed of a chargeable power storage device such as a battery or an electric double layer capacitor. The positive electrode of DC power supply 20 is connected to a positive-side cable 21. On the other hand, the negative electrode of DC power supply 20 is connected to a negative-side cable 22 equivalent to a ground line.

Rotating electric machine M1 formed of a three-phase AC synchronous motor, a three-phase induction motor or the like receives AC power from inverter 100 to generate a rotational driving force. Rotating electric machine M1 is also used as a power generator. Electric power generated during deceleration (regeneration) is converted into DC voltage by inverter 100 and smoothed by smoothing capacitor 30 for use in charging DC power supply 20.

Inverter 100 is a three-phase inverter including power semiconductor switching devices Q1-Q6. Although in the embodiment of the present invention the power semiconductor switching device is formed, for example, of an IGBT (Insulated Gate Bipolar Transistor), any other power semiconductor switching device such as a bipolar transistor or a MOS transistor may be used. In the following, the power semiconductor switching device is also referred to as a transistor.

Inverter 100 is comprised of a U-phase arm 102, a V-phase arm 104, and a W-phase arm 106 connected in parallel between a positive electrode bus bar 170 and a negative electrode bus bar 171. U-phase arm 102 is comprised of transistors Q1, Q2 connected in series between positive electrode bus bar 170 and negative electrode bus bar 171. Similarly, V-phase arm 104 is comprised of transistors Q3, Q4 connected in series between positive electrode bus bar 170 and negative electrode bus bar 171, and W-phase arm 106 is comprised of transistors Q5, Q6 connected in series between positive electrode bus bar 170 and negative electrode bus bar 171.

Positive electrode bus bar 170 and negative electrode bus bar 171 are electrically connected with positive side cable 21 and negative side cable 22, respectively, through a connection terminal 60.

In each phase arm, the connection point between the transistor in the upper arm and the transistor in the lower arm connected in series is electrically connected with each phase end of each phase coil of rotating electric machine M1. Specifically, the connection points of U-phase arm 102, V-phase arm 104, and W-phase arm 106 are electrically connected with the respective one ends of a U-phase coil, a V-phase coil, and a W-phase coil by output bus bars 174, 176, and 178, respectively, through a connection terminal 70. The other ends of the phase coils of rotating electric machine M1 are electrically connected with each other at a neutral point N1.

Passing current of transistors Q1-Q6 is taken out as each phase current by output bus bars 172, 174, 176 and transmitted to each phase coil of rotating electric machine M1. A current sensor 118 is provided for output bus bars 172, 174, 176 to send the detected each phase current to a control circuit 40.

Drive control circuits DC1-DC6 are provided respectively corresponding to transistors Q1-Q6. Drive control circuits DC1-DC6 control the on/off of the corresponding transistors Q1-Q6 in response to respective switching control signals S1-S6 generated by a signal generation circuit 50. Furthermore, anti-parallel diodes D1-D6 are provided in parallel with transistors Q1-Q6, respectively, for allowing reverse current to pass through.

Control circuit 40 controls an operation of semiconductor power conversion apparatus (inverter) 100. Specifically, control circuit 40 receives a torque command value of rotating electric machine M1, each phase current value, and an input voltage to inverter 100 (i.e. an output voltage of DC power supply 20) to calculate an applied voltage to each phase coil of rotating electric machine M1 based on well-known PWM (Pulse Width Modulation) control and output the calculation result to signal generation circuit 50.

Signal generation circuit 50 receives the voltage calculation result for each phase coil from control circuit 40 to generate switching control signals S1-S6 that are PWM control signals for controlling the on/off of transistors Q1-Q6. Switching control signals S1-S6 are sent to drive control circuits DC1-DC6, respectively.

It is noted that a converter (not shown) for DC voltage conversion may additionally be arranged on the side of DC power supply 20 away from smoothing capacitor 30. In such a configuration, by controlling the operation of the converter, DC voltage of inverter 100 can be controlled variably such that AC voltage amplitude applied to rotating electric machine M1 attains the optimum level according to the operation region of rotating electric machine M1. Specifically, control circuit 40 receives the aforementioned torque command value and motor rotational speed to calculate the optimum value (target value) of DC voltage (input voltage) of inverter 100. Control circuit 40 then generates a control signal for specifying a switching operation of the converter which is necessary to realize this input voltage.

Figure 2:
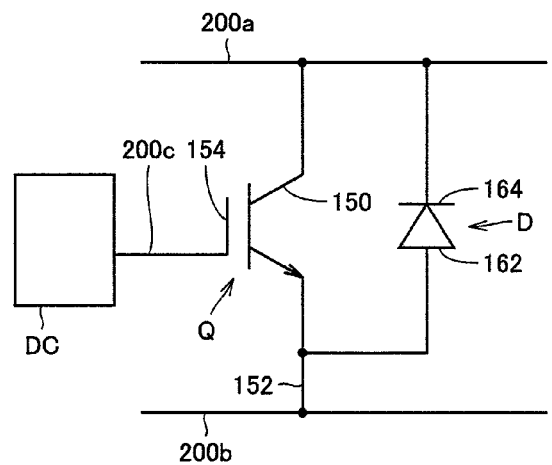
FIG. 2 is an electrical circuit diagram illustrating a bus bar connection to a semiconductor device in each arm.

FIG. 2 is an electrical circuit diagram illustrating a bus bar connection to a semiconductor device in each arm.

Referring to FIG. 2, in each arm, a transistor Q (transistors Q1-Q6 or a collective designation of transistors in the not-shown converter) typically formed of IGBT and a diode D (reverse parallel diodes D1-D6 or a collective designation of diodes in the not-shown converter) are provided each as a "semiconductor device."

Transistor Q has current electrodes (main electrodes) 150, 152 and a control electrode 154 as electrodes and is configured such that passing current between current electrodes 150 and 152 is controlled according to a potential or current at control electrode 154.

Control electrode 154 corresponds to a gate in IGBT and a MOS transistor and corresponds to a base in a bipolar transistor. Current electrode 150, 152 correspond to a collector and an emitter in IGBT and a bipolar transistor and correspond to a drain and a source in a MOS transistor. Diode D has an anode (positive electrode) 162 and a cathode (negative electrode) 164 as electrodes.

For example, transistor Q has a vertical transistor structure in which current electrodes 150, 152 are formed on the respective opposing surfaces (main electrode surfaces) of a semiconductor chip. Then, control electrode 154 is formed on either one of the main electrode surfaces. Control electrode 154 has its potential or current driven by a drive control circuit DC (a collective designation of drive control circuits DC1-DC6). Signal wiring (not shown) electrically connecting sensors and circuits provided for drive control circuit DC and the transistors is also provided in parallel with the drive wiring (not shown). The above-noted drive wiring and signal wiring is formed of a bus bar 200c.

The current electrode of transistor Q (also referred to as the transistor electrode hereinafter) 150 and the cathode of diode D (also referred to as the diode electrode hereinafter) 164 are connected with a bus bar 200a. Anode 162 of diode D is the electrode in common with current electrode 152 of transistor Q (also referred to as common electrode 152 hereinafter) and is connected with a bus bar 200b. Each of bus bars 200a, 200b corresponds to one of positive electrode bus bar 170, negative electrode bus bar 171, and output bus bars 172, 174, 176 shown in FIG. 1.

In other words, each electrode of the semiconductor device (transistor Q and diode D) is electrically connected to a circuit component external to the semiconductor device, specifically, positive side cable 21 (the positive electrode of the DC power supply), negative side cable 22 (the negative electrode of the DC power supply), each phase coil wiring of rotating electric machine M1, drive control circuit DC, or the like, through bus bar 200a, 200b, or 200c formed of a conductor such as copper or aluminum. In the following, bus bar 200c is also referred to as a "signal line bus bar" as distinguished from bus bars 200a, 200b through which current associated with power conversion passes.

Figure 3:
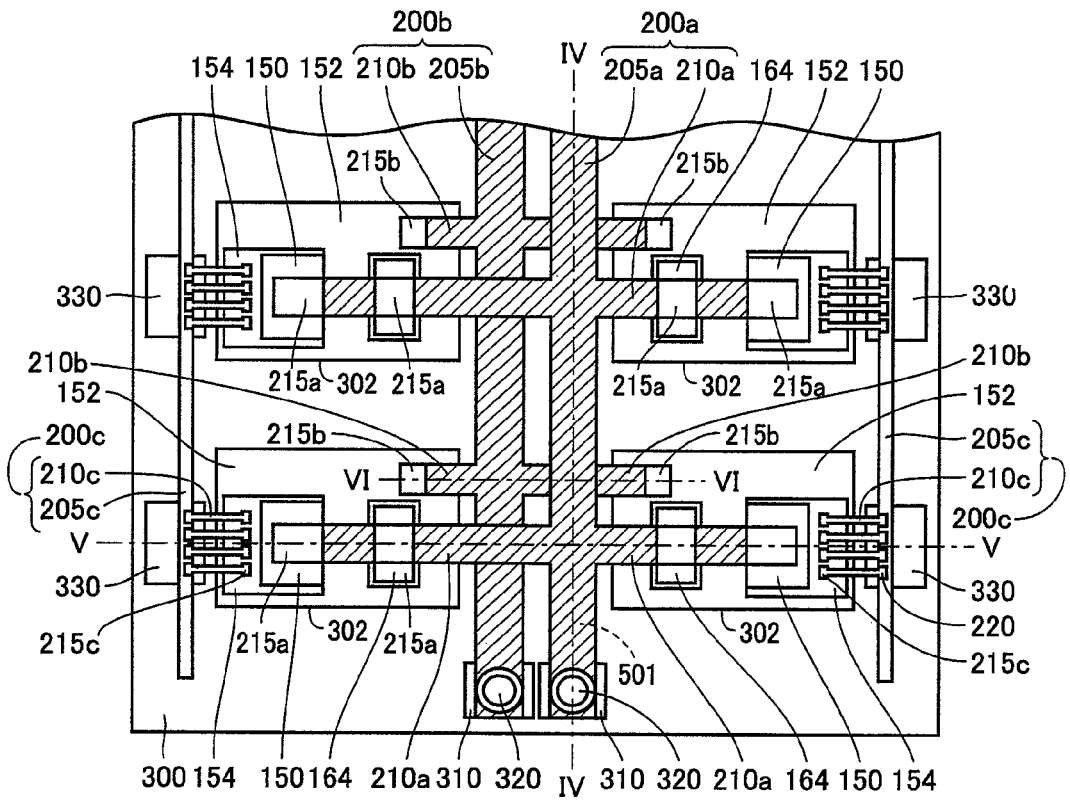
FIG. 3 is a plan view illustrating a connection structure between a semiconductor device and a bus bar in the semiconductor power conversion apparatus in accordance with the present embodiment.

FIG. 3 is a plan view illustrating a connection structure between the semiconductor devices and the bus bars. FIG. 3 corresponds to a top view of inverter 100 mounted on a cooling plate 300.

Referring to FIG. 3, each of semiconductor chips 302 arranged on cooling plate 300 has transistor Q and diode D shown in FIG. 2.

Transistor electrode 150 and diode electrode 164 are provided each as a device top-side electrode and electrically connected with bus bar 200a. Bus bar 200a includes a bus bar portion 205a and a lead portion 210a. Of bus bar 200a, bus bar portion 205a corresponds to a "non-connection section with the electrode" in the present invention and lead portion 210a corresponds to a "connection section with the electrode" in the present invention. Bus bar portion 205a extends in the up and down direction on the drawing sheet and is supported by a fixed post 310 formed of an insulating material.

Figure 4:
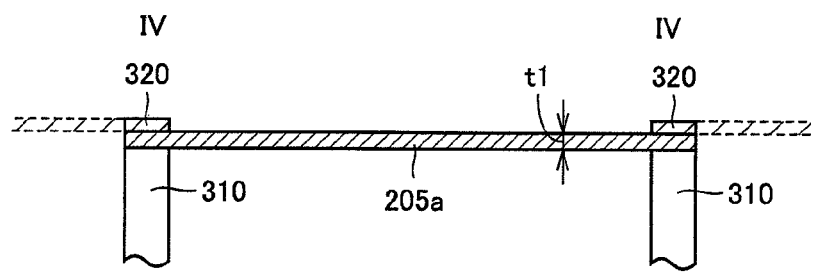
FIG. 4 is a cross-sectional view taken along IV-IV in FIG. 3.

Referring to FIG. 4 that is a cross-sectional view taken along IV-IV in FIG. 3, bus bar portion 205a (thickness t1) is supported by fixed post 310 and is electrically connected to a circuit component external to the semiconductor device as described above through a connection member 320 corresponding to connection terminal 60 or 70 shown in FIG. 1. Although not shown, fixed post 310 is fixed to cooling plate 300 by a fastening member such as a bolt or by adhesion.

Referring to FIG. 3 again, lead portion 210a is formed integrally with bus bar portion 205a and is provided to branch from bus bar portion 205a such that it extends in the right and left direction on the drawing sheet. Connection parts 215a with transistor electrode 150 and diode electrode 164 are provided at part of lead portion 210a. That area of bus bar portion 205a and lead portion 210a excluding connection part 215a, namely, the hatched area in FIG. 3 of bus bar 200a has an insulating coat 501 formed by covering the surface with an insulating material such as an insulating film.

Figure 5:
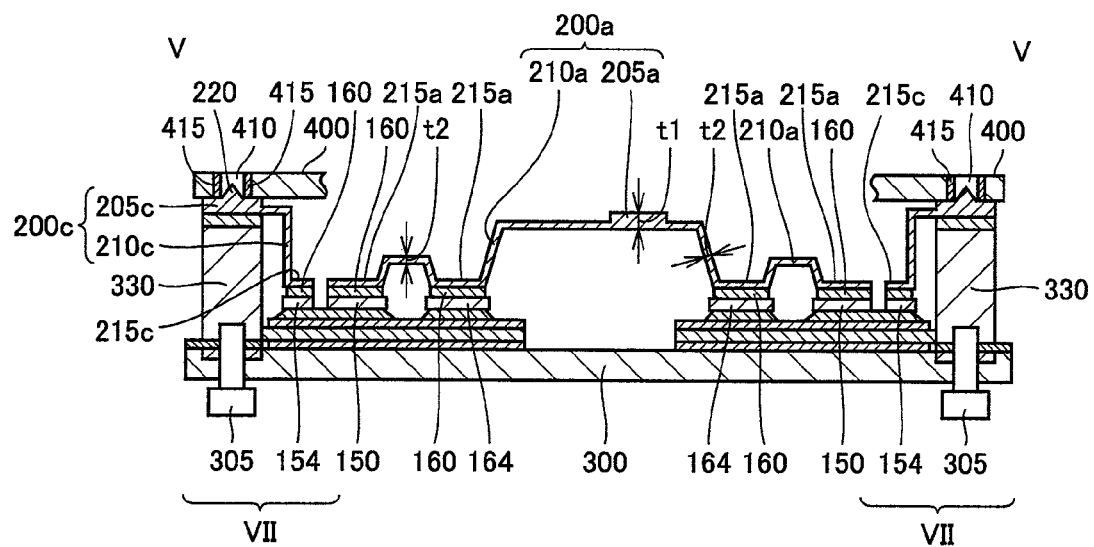
FIG. 5 is a cross-sectional view taken along V-V in FIG. 3.

Referring to FIG. 5 that is a cross-sectional view taken along V-V in FIG. 3, bus bar 200a having lead portion 210a and bus bar portion 205a is formed by integrally press-forming a metal such as copper or aluminum such that a thickness t2 of lead portion 210a including connection part 215a is smaller than a thickness t1 of bus bar portion 205a (t2<t1) and that lead portion 210a branches from bus bar portion 205a.

Furthermore, lead portion 210a is press-formed such that connection part 215a is opposed to transistor electrode 150 and diode electrode 164 and that the other part is bent as appropriate away from the semiconductor devices. Connection parts 215a are electrically directly connected with transistor electrode 150 and diode electrode 164 by a connecting material 160 such as solder without using bonding wire.

Thickness t2 of lead portion 210a including connection part 215a is determined by a thickness limit that does not cause a break with application of current, in view of the amount of passing current, and by a formation limit in press-forming. Thickness t2 is reduced, for example, to the order of 0.1 mm or so.

In this manner, of bus bar 200a, at least connection part 215a with the electrode of the semiconductor device (transistor Q or diode D) is reduced in thickness, so that the amount of thermal expansion at the connection part at a temperature rise can be reduced and the acting thermal stress can be reduced, even in a structure in which the electrodes of semiconductor devices and the bus bars are electrically directly connected with each other using the integrally shaped bus bar 200a without bonding wire. In other words, a "thermal stress relief mechanism" in the present invention can be formed by reducing the thickness of at least connection part 215a of lead portion 210.

Referring to FIG. 3 again, common electrode 152 is provided as a device lower-side electrode and is electrically connected with bus bar 200b. Bus bar 200b is configured similarly to bus bar 200a and includes a bus bar portion 205b and a lead portion 210b. Bus bar portion 205b extends in the up and down direction on the drawing sheet and is supported by fixed post 310 formed of an insulating material, similarly to bus bar portion 205a. Bus bar portion 205b is also electrically connected with a circuit component external to the semiconductor device as described above, through connection member 320 corresponding to connection terminal 60 or 70 shown in FIG. 1, on fixed post 310.

Figure 6:
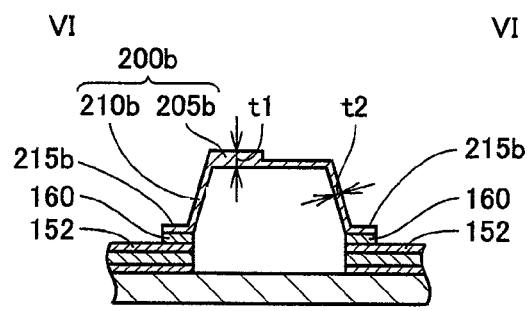
FIG. 6 is a cross-sectional view taken along VI-VI in FIG. 3.

Referring to FIG. 6 that is a cross-sectional view taken along VI-VI in FIG. 3, bus bar 200b is also provided similarly to bus bar 200a such that thickness t2 of lead portion 210b including connection part 215b is smaller than thickness t1 of bus bar portion 205b (t2<t1) and that lead portion 210b branches from bus bar portion 205b. Bus bar 200b is also fabricated similarly to bus bar 200a by integrally press-forming a metal such as copper or aluminum.

Lead portion 210b is press-formed such that connection part 215b is opposed to common electrode 152 and the other part is bent as appropriate away from the semiconductor devices. Connection part 215b is directly electrically connected with common electrode 152 by connecting material 160 such as solder without using bonding wire.

Therefore, at least connection part 215b of bus bar 200b is also reduced in thickness, so that the amount of thermal expansion at the connection part at a temperature rise can be reduced and the acting thermal stress can be relieved, even in a structure in which the electrodes of semiconductor devices and the bus bar are electrically directly connected with each other without bonding wire.

Referring to FIG. 3 again, control electrode 154 is electrically connected with signal line bus bar 200c. Signal line bus bar 200c is fabricated by integrally press-forming a metal such as copper or aluminum, similarly to bus bars 200a, 200b, and includes the integrally shaped bus bar portion 205c and lead portion 210c. Bus bar portion 205c extends in the up and down direction on the drawing sheet and is fixed with attached to a fixed post 330 formed of an insulating material. Lead portion 210c is provided in such a shape that branches from bus bar portion 205b. A part of lead portion 210c forms connection part 215c that is directly connected with control electrode 154.

Since signal line bus bar 200c is provided as drive wiring for control electrode 154 or signal wiring transmitting sensor outputs etc. as described above, a plurality of signal line bus bars 200c are arranged in parallel. The respective bus bar portions 205c of these independent signal line bus bars 200c are electrically insulated from each other by an insulating film or the like and arranged in a stack. In that part of lead portion 210c excluding connection part 215c, insulating coat 501 is formed by covering the surface with an insulating material such as an insulating film.

Figure 7:
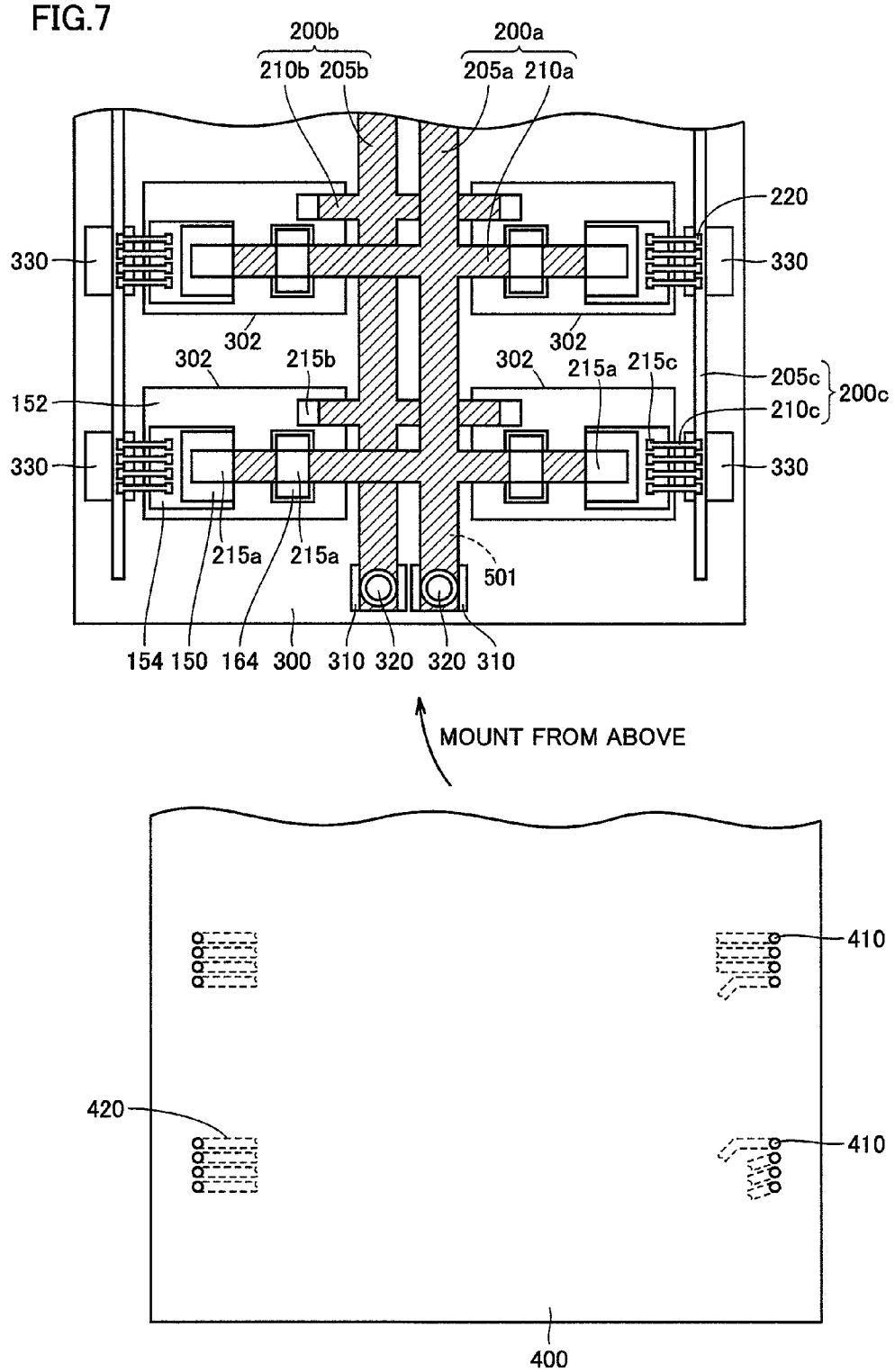
FIG. 7 is a conceptual diagram illustrating mounting of a circuit board to the semiconductor power conversion apparatus.

As shown in FIG. 7, a circuit board 400 equipped with circuit components such as drive control circuit DC is mounted on the main body of inverter 100 using fixed post 330. Circuit board 400 is attached to fixed post 330 with signal line bus bar 200c interposed. Then, the circuit component such as drive control circuit DC on circuit board 400 is electrically connected with the semiconductor device by each signal line bus bar 200c.

Circuit board 400 is provided with a mounting hole 410. Furthermore, a conductive path 420 is formed between a circuit component on circuit board 400 and mounting hole 410 by forming a wiring pattern. In other words, mounting hole 410 additionally serves as a terminal for connecting the above-noted circuit component with the outside.

In the region VII in FIG. 5, a cross section taken along V-V in FIG. 3 is shown with circuit board 400 being mounted.

Fixed post 330 supporting bus bar portion 205c of signal line bus bar 200c is fixed to cooling plate 300 by a fastening member 305 such as a bolt or by adhesion. A protrusion portion 220 for being fitted into mounting hole 410 of circuit board 400 is provided on the surface opposite to that surface having bus bar portion 205c attached to fixed post 330. Protrusion portion 220 is a conductor portion integrally formed with bus bar portion 205c. In other words, protrusion portion 220 can also be fabricated by press-forming.

On a side surface of mounting hole 410 of circuit board 400, a conductive connection portion 415 is formed which is electrically continuous from conductive path 420 (FIG. 7). Therefore, an electrical contact is formed between protrusion portion 220 and conductive connection portion 415 by fitting protrusion portion 220 of signal line bus bar 200c into mounting hole 410 of circuit board 400 and then performing resistance pressure welding or ultrasonic/laser bonding, so that a circuit component such as drive control circuit DC on circuit board 400 and signal line bus bar 200c can electrically be connected with each other.

Signal line bus bar 200c is also provided such that the thickness of lead portion 210c including connection part 215c is smaller than the thickness of bus bar portion 205b and that lead portion 210b branches from bus bar portion 205b, similarly to bus bars 200a, 200b.

Therefore, at least connection part 215c of bus bar 200c is also reduced in thickness, so that the amount of thermal expansion at the connection part at a temperature rise can be reduced and the acting thermal stress can be relieved, even in a structure in which the control electrodes of semiconductor devices and the bus bar are electrically directly connected with each other without bonding wire.

Therefore, even for connection part 215c with control electrode 154, thermal stress acting on the connection part at a temperature rise due to heat from any other circuit component can be relieved because of the bus bar connection structure similar to the one for transistor electrode 150, common electrode 152, and diode electrode 164.

As described above, for each of bus bars 200a, 200b and signal line bus bar 200c, bus bar portions 205a, 205b, 205c and lead portions 210a, 210b, 210c including connection parts 215a, 215b, 215c are integrally shaped and connection parts 215a, 215b, 215c are directly connected with the electrodes of semiconductor devices by jointing material 160, thereby eliminating the need for wire bonding and reducing the manufacturing costs.

In addition, lead portions 210a, 210b, 210c are reduced in thickness so that at least connection parts 215a, 215b, 215c are reduced in thickness. Therefore, the amount of thermal expansion at the connection parts at a temperature rise is reduced and the acting thermal stress is relieved, resulting in an interconnection structure that allows them to connect each other stably even at a temperature rise. As a result, in a high power and compact power conversion apparatus typically applied to a vehicle, even when the bus bar and the electrode are directly connected with each other without bonding wire, their connection is stable at a temperature rise, thereby preventing disconnection.

Figure 8:
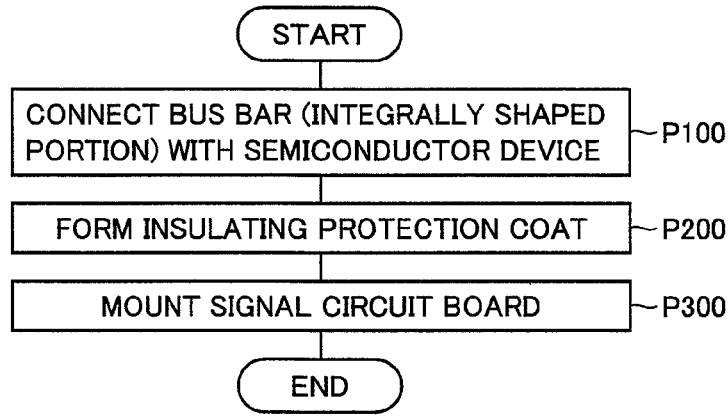
FIG. 8 is a flowchart illustrating a process of manufacturing the semiconductor power conversion apparatus in accordance with an embodiment of the present invention.

FIG. 8 shows a process of manufacturing the semiconductor power conversion apparatus in accordance with an embodiment of the present invention, more specifically, an assembly process thereof.

Referring to FIG. 8, in the semiconductor power conversion apparatus in accordance with the present embodiment, in process P100, electrical connection is established by connecting a semiconductor devices formed on each semiconductor chip 302 on cooling plate 300 with bus bars 200a-200c described above.

Then, upon completion of the bus bar connection operation in process P100, an insulating protection coat forming operation for ensuring insulation of connection parts 215a, 215b, 215c is performed in process P200.

Then, upon completion of the insulating protection coat forming operation in process P200, an operation of mounting circuit board 400 shown in FIG. 7 is performed in process P300.

Figure 9:
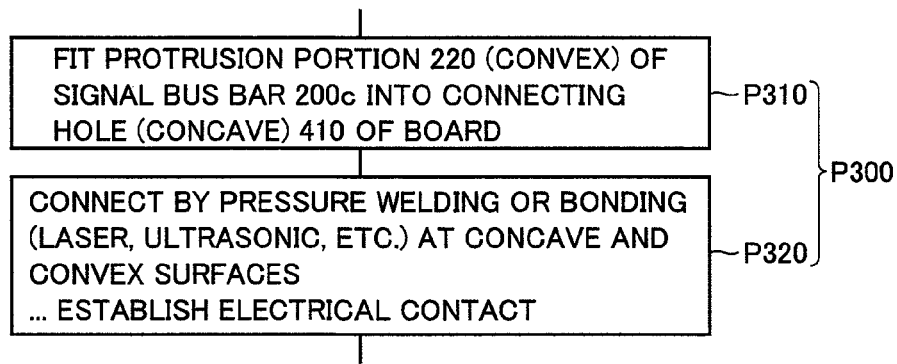
FIG. 9 is a flowchart illustrating a signal circuit board mounting process in detail.

As shown in FIG. 9, process P300 includes sub-processes P310 and P320. In sub-process P310, as shown in FIG. 5, protrusion portion 220 of signal line bus bar 200c is fitted into mounting hole 410 of circuit board 400. In sub-process P320, pressure welding or laser or ultrasonic bonding is performed at the concave and convex side surfaces that are fitted together in sub-process P310, so that an electrical contact can be secured between signal line bus bar 200c and mounting hole 410 also serving as a terminal of a circuit component such as drive control circuit DC.

In this manner, signal line bus bar 200c is provided with protrusion portion 220 to be mounted on circuit board 400, so that alignment becomes easier in the operation of mounting circuit board 400, thereby improving the operability. Accordingly, the throughput per unit time in the circuit board mounting operation (process P300) can be increased, thereby reducing the manufacturing costs of the semiconductor power conversion apparatus.

Next, the insulating protection coat forming operation in process P200 will be described in detail.

Figure 10:
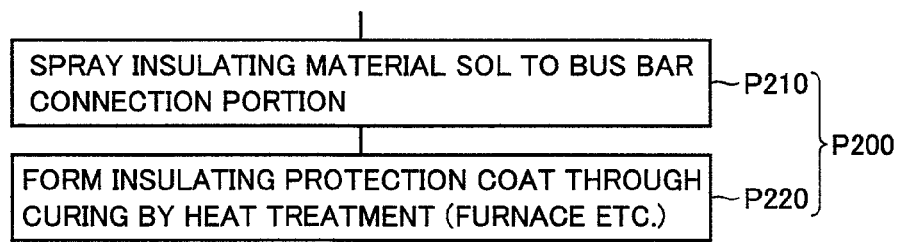
FIG. 10 is a flowchart illustrating a first example of an insulating protection coat forming process.

FIG. 10 shows a first example of the insulating protection coat forming process.

Referring to FIG. 10, process P200 for forming an insulating protection coat includes sub-processes P210 and P220.

Figure 11:
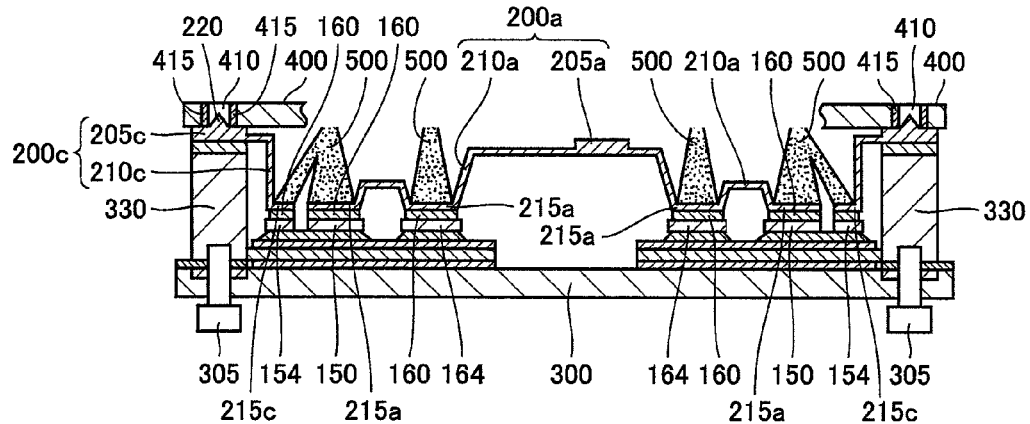
FIG. 11 is a conceptual diagram illustrating an operation of applying an insulating material in the first example of the insulating protection coat forming process.

As shown in FIG. 11, connection part 215a, 215b, 215c of each bus bar 200a, 200b, 200c requires insulation since an insulating coat (reference numeral 501 in FIG. 3) such as an insulating film has not yet been formed. In sub-process P210, each connection part is coated with an insulating material 500. For example, by spraying a sol-like insulating material (typically, a thermosetting resin such as silicone), a part that requires insulation can be coated locally with insulating material 500.

Figure 12:
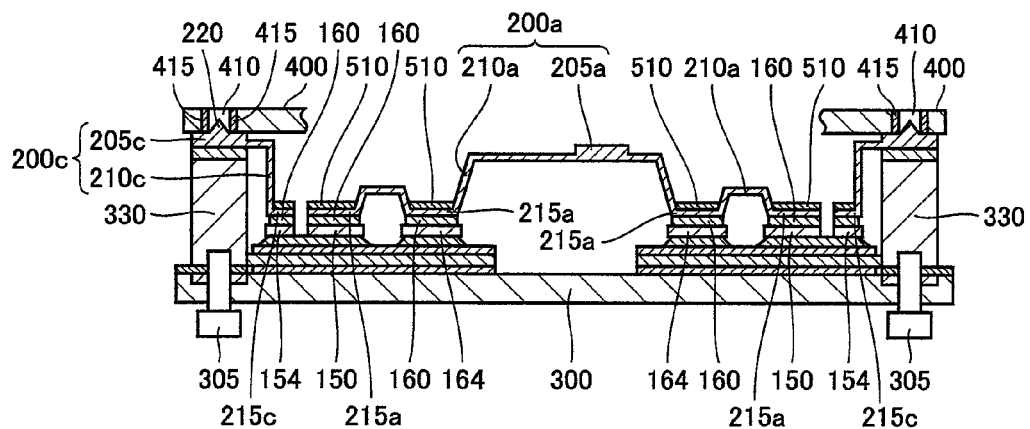
FIG. 12 shows an insulating protection coat formed through the operation in FIG. 11.

Referring to FIG. 10 again, in sub-process P220, the insulating material coated on the surfaces of connection parts 215a, 215b, 215c is subjected to heat treatment using a furnace or the like. As a result, as shown in FIG. 12, the insulating material is cured to form an insulating protection coat 510 on the surfaces of connection parts 215a, 215b, 215c.

As a result, insulation of connection parts 215a, 215b, 215c is secured, and in addition, the curing treatment improves the mechanical connection strength between the bus bar and the electrode.

Figure 13:
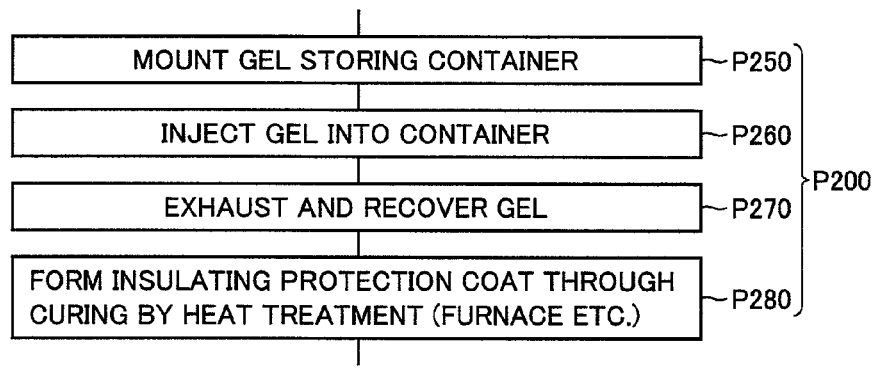
FIG. 13 is a flowchart illustrating a second example of the insulating protection coat forming process.

FIG. 13 shows a second example of the insulating protection coat forming process.

Referring to FIG. 13, process P200 for forming an insulating protection coat includes sub-processes P250-P280.

Figure 14:
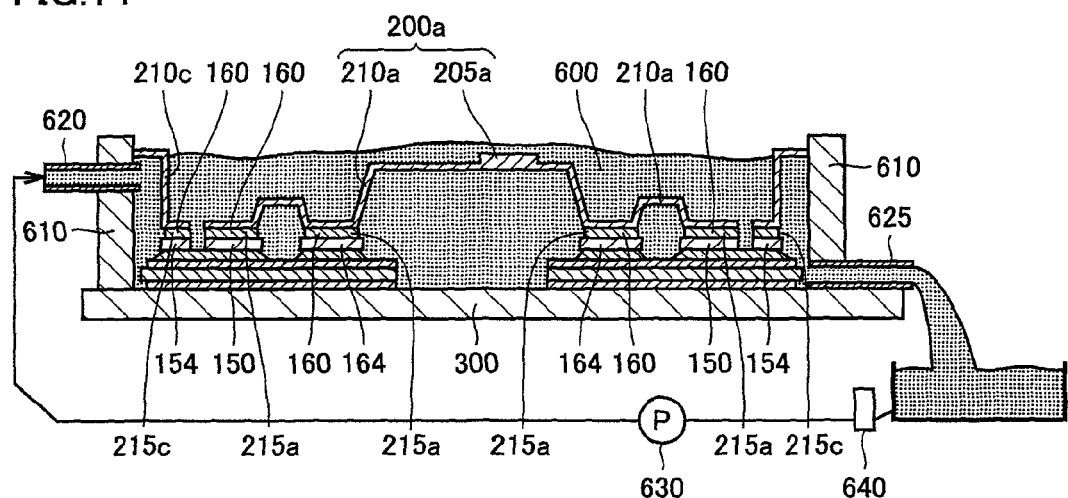
FIG. 14 is a conceptual diagram illustrating the second example of the insulating protection coat forming process.

In sub-process P250, as shown in FIG. 14, a gel storage container 610 is attached to surround that part of the semiconductor device which is connected with the bus bar. Gel storage container 610 is provided with a gel inlet 620 and a gel outlet 625.

In sub-process P260, the gel-like insulating material (typically, thermosetting resin) 600 sucked through a filter 640 by a pump 630 is supplied from gel inlet 620 into gel storage container 610. Accordingly, the semiconductor devices and the bus bars are soaked as a whole in gel-like insulating material 600.

In the subsequent sub-process P270, gel-like insulating material 600 in gel storage container 610 is exhausted from gel outlet 625. The exhausted gel-like insulating material 600 is recovered and reused. After exhaustion of gel-like insulating material 600, a coating of gel-like insulating material 600 adheres on the surfaces of the bus bars and the semiconductor devices.

Figure 15:
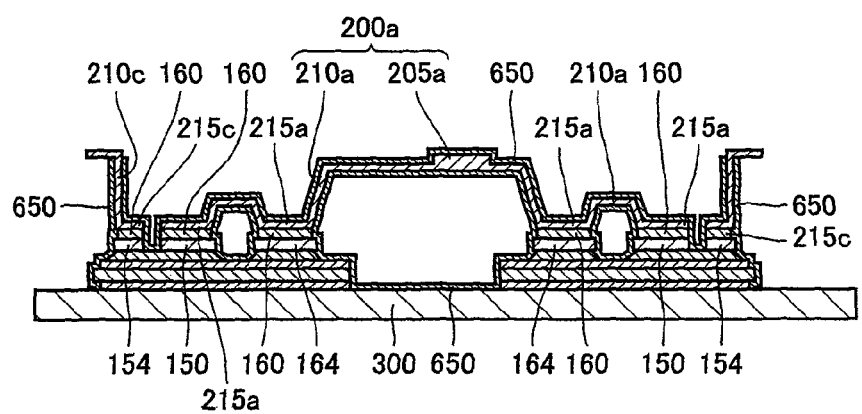
FIG. 15 shows an insulating protection coat formed through the operation in FIG. 14.

In sub-process P280, gel-like insulating material 600 in the form of a coating is subjected to a heat curing treatment using a furnace or the like. As a result, as shown in FIG. 15, the insulating material is cured to form an insulating protection coat 650 on the surface of the semiconductor devices and the bus bars as a whole, including the surfaces of connection parts 215a, 215b, 215c. In addition, the curing treatment provides insulation and also improves mechanical connection strength between the bus bar and the electrode.

According to the insulating protection coat forming process in the second example shown in FIG. 13, it is not necessary to form an insulating coat from an insulating film or the like, for that part other than connection parts 215a, 215b, 215c of bus bars 200a, 200b, 200c, prior to the bus bar connecting process (process P100). In other words, after the integrally shaped bus bars 200a, 200b, 200c are fabricated with a bare material such as copper, aluminum, or brass that is not insulated, bus bars 200a, 200b, 200c can be insulated and protected as a whole including connection parts 215a, 215b, 215c through the insulating protection coat forming process (P250-P280) after completion of the bus bar connecting process (process P100). Thus, the manufacturing costs of the bus bar can be reduced. In addition, gel-like insulating material 600 other than the one adhering on the surfaces of the semiconductor devices and the bus bars can be recovered and reused, thereby reducing the costs of the insulating material.

In particular, in the semiconductor power conversion apparatus in accordance with the present embodiment, a bus bar connection structure can be realized without using wire bonding, so that the volume (spatial extent) of the connection parts that can be insulated and protected can significantly be reduced. Therefore, since an insulating coat is formed locally only at a surface portion of the connection part, insulation can be secured even with the reduced amount of insulating material usage. In addition, since the insulating protection coat is formed through the curing treatment, the mechanical connection strength can also be secured.

In a structure in which bus bars and semiconductor devices are electrically connected through wire bonding, the entire bonding wire needs to be insulated from the surroundings. Thus, in general, insulation is provided for a large volume by providing a housing so as to surround the semiconductor devices and the bus bars and then filling the housing with a gel-like insulating material. By contrast, in the semiconductor power conversion apparatus in accordance with the present embodiment, the improvement of the bus bar connection structure can significantly reduce the amount of insulating material for use and reduce the manufacturing costs.

Although in the foregoing description lead portions 210a, 210b, 210c of bus bars 200a, 200b, 200c are reduced in thickness, the lead portion may be structured as shown in FIG.

16 as a modification in order to relieve thermal stress at the connection part between the electrode and the bus bar.

Figure 16:
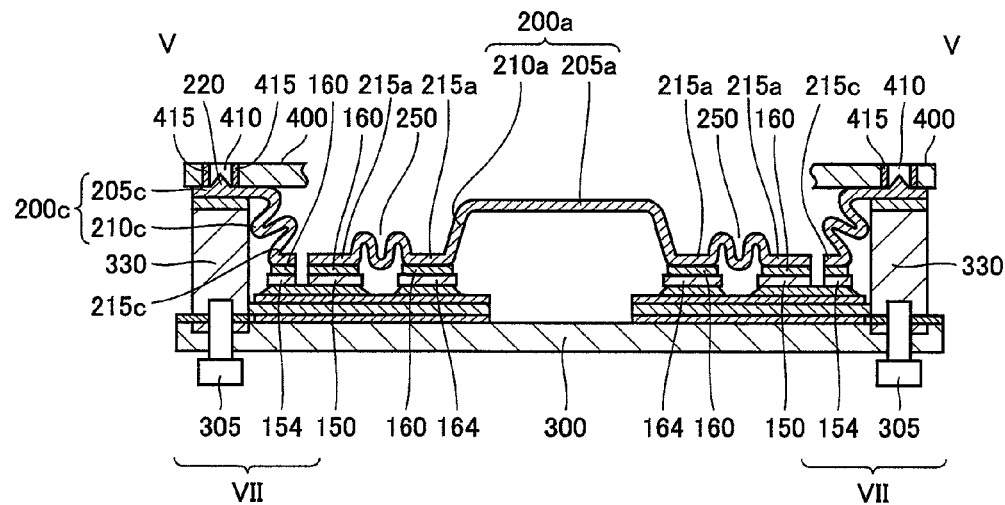
FIG. 16 is a first diagram illustrating a modification of a bus bar shape in the semiconductor power conversion apparatus in accordance with the present embodiment.

As can be understood from comparison between FIG. 16 and FIG. 5, in the bus bar in accordance with the modification, loose parts 250 are provided as appropriate at non-connection parts with electrodes, of lead portions 210a, 210c of bus bars 200a, 200c. Loose part 250 may be formed by bending or presswork. Provision of loose part 250 ensures that lead portion 210a can be displaced in the direction in which lead portion 210a extends, in response to thermal stress acting on connection parts 215a, 215c, whereby thermal stress at the connection part between an electrode and a bus bar can be relieved even with a uniform thickness of the entire bus bar without reducing the thickness of lead portion 210a. In short, the "thermal stress relief mechanism" in the present invention can also be formed with such loose part 250.

Figure 17:
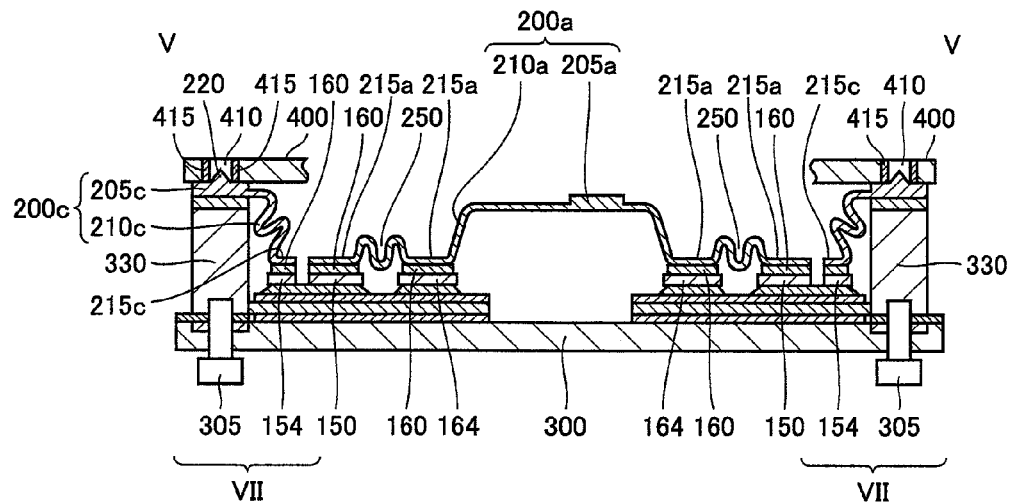
FIG. 17 is a second diagram illustrating a modification of a bus bar shape in the semiconductor power conversion apparatus in accordance with the present embodiment.

Furthermore, as shown in FIG. 17, the structures in FIG. 5 and FIG. 16 can be combined. Specifically, loose parts 250 may be provided for lead portions 210a, 210c each having the reduced thickness. As a result, the effect of relieving thermal stress can be enhanced. It is hereby confirmed that the similar modification may also be applied to bus bar 200b, although not shown in FIG. 16 and FIG. 17. In FIG. 16 and FIG. 17, the bus bar structure may be formed such that the lead portion is provided with a part shaped to be displaced in response to thermal stress acting on the connection part, in a manner different from loose part 250.

The embodiment disclosed herein should be understood as being illustrative rather than being (imitative in all respects. The scope of the present invention is shown not by the foregoing description but by the claims and equivalents to the claims and all modifications with the scope of the claims are intended to be embraced.

INDUSTRIAL APPLICABILITY

The present invention is applicable to a semiconductor power conversion apparatus having a structure in which an electrode of a semiconductor device is electrically connected with another circuit component through a bus bar.

The invention claimed is:

1. A semiconductor power conversion apparatus comprising:
   a semiconductor device for performing power conversion; and
   a bus bar for electrically connecting an electrode of said semiconductor device and a circuit component external to the semiconductor device with each other, wherein
   said bus bar is configured to include a connection section with said electrode and a non-connection section with said electrode that are integrally shaped and to have a thermal stress relief mechanism for relieving thermal stress acting on a connection part formed of a part of said connection section and electrically connected with said electrode without through bonding wire in a state of being opposed to said electrode,
   said connection part is formed to have a thickness smaller than that of said non-connection section thereby forming said thermal stress relief mechanism,
   said non-connection section is arranged common to a plurality of said semiconductor devices to extend in a first direction, and
   said connection section is provided corresponding to each said semiconductor device in such a shape that branches from said non-connection section and extends in a second direction crossing said first direction, and said connection section has at least a portion in thickness smaller than said non-connection section.

2. The semiconductor power conversion apparatus according to claim 1, wherein said connection section is formed such that in addition to said connection part, a thickness of at least part of that portion excluding said connection part is smaller than that of said non-connection section, thereby forming said thermal stress relief mechanism.

3. The semiconductor power conversion apparatus according to claim 1, wherein said connection section has a part shaped to be displaceable in response to thermal stress acting on said connection part, as said thermal stress relief mechanism, in at least a part of a non-connection part with said electrode.

4. The semiconductor power conversion apparatus according to claim 1, wherein said connection section has a part having a shape thinner than a thickness of said non-connection section and shaped to be displaceable in response to thermal stress acting on said connection part, in at least a part of a non-connection part with said electrode.

5. The semiconductor power conversion apparatus according to claim 1, wherein
   said non-connection section has an electrical connection portion with said circuit component, and
   said connection section is shaped to branch from said non-connection section and to be thinner than said non-connection section.

6. The semiconductor power conversion apparatus according to claim 1, further comprising:
   a fixed post formed of an insulating material for attaching said non-connection section; and
   a circuit board mounted on said fixed post with said non-connection section interposed, wherein
   said non-connection section has a protrusion portion provided integrally with said non-connection section on that surface opposite to a surface having said fixed post attached thereon, and
   said circuit board has
   a mounting hole having said protrusion portion fitted therein and
   a conductive portion configured such that electrical connection is established between said non-connection section and a circuit component on said circuit board by connecting said protrusion portion to said mounting hole.

7. The semiconductor power conversion apparatus according to claim 1, wherein
   said bus bar further includes
   a first protection coat formed by covering a surface of a non-connection part with said electrode with an insulating material and
   a second protection coat formed by heat-curing an insulating material coated on a surface of said connection part with said electrode in a state of being connected with said electrode.

8. The semiconductor power conversion apparatus according to claim 1, wherein said bus bar further includes a protection coat formed by heat-curing an insulating material coated on the surfaces of said connection section and said non-connection section in a state of being connected with said electrode.

9. The semiconductor power conversion apparatus according to claim 1, wherein
   said semiconductor device is configured such that current between first and second current electrodes is controlled according to a potential or current of a control electrode, and said bus bar electrically connects said control electrode with said circuit component.

10. The semiconductor power conversion apparatus according to claim 1, wherein
said semiconductor device is configured such that current between first and second current electrodes is controlled according to a potential or current of a control electrode, and
said bus bar electrically connects one of said first and second current electrodes with said circuit component.

11. The semiconductor power conversion apparatus according to claim 1, wherein said bus bar is electrically connected with electrodes of a plurality of said semiconductor devices in common.

12. A method of manufacturing a semiconductor power conversion apparatus comprising:
a first process of electrically connecting a bus bar with an electrode of a semiconductor device, said bus bar being configured to include a connection section with said electrode of said semiconductor device and a non-connection section with said electrode that are integrally shaped, said connection section having a thermal stress relief mechanism for relieving thermal stress acting on a connection part with said electrode; said connection part being electrically connected with said electrode without through bonding wire in a state of being opposed to said electrode; and
a second process for forming an insulating protection coat for said connection part of said bus bar with said electrode formed through said first process, wherein
said connection part is formed to have a thickness smaller than that of said non-connection section thereby forming said thermal stress relief mechanism,
said non-connection section is arranged common to a plurality of said semiconductor devices to extend in a first direction, and
said connection section is provided corresponding to each said semiconductor device in such a shape that branches from said non-connection section and extends in a second direction crossing said first direction, and said connection section has at least a portion in thickness smaller than said non-connection section.

13. The method of manufacturing a semiconductor power conversion apparatus according to claim 12, wherein
a first protection coat is provided prior to said first process, and being formed by previously covering with an insulating material a surface of non-connection part with said electrode of said bus bar, and
said second process includes
a first sub-process of coating with an insulating material a surface of said connection part with said electrode in a state of being connected with said electrode, and
a second sub-process of forming a second protection coat by heat-curing a coating formed through said first sub-process.

14. The method of manufacturing a semiconductor power conversion apparatus according to claim 13, wherein in said first sub-process, the surface of said connection part is coated with an insulating material by spraying a sol-like insulating resin.

15. The method of manufacturing a semiconductor power conversion apparatus according to claim 13, wherein
said second process includes
a first sub-process of charging a gel-like insulating material for soaking said semiconductor device and said bus bar,
a second sub-process of exhausting and recovering said insulating material so that a coating of the insulating material is left on the surfaces of said connection section and said non-connection section of said bus bar, and
a third sub-process of heat-curing the coating formed through said second sub-process thereby forming a protection coat.

16. The method of manufacturing a semiconductor power conversion apparatus according to claim 12:
wherein in said first process, said non-connection section is attached to a fixed post formed of an insulating material,
said method further comprising
a third process of mounting a circuit board on said fixed post with said non-connection section interposed,
said third process including
a first sub-process of fitting a protrusion portion in a mounting hole provided in said circuit board, said protrusion portion being provided integrally with said non-connection section on that surface opposite to a surface of said non-connection section having said fixed post attached thereon, and
a second sub-process of connecting said protrusion portion with a conductive portion provided on a side surface of said mounting hole and electrically connected to a circuit component on said circuit board, thereby electrically connecting said conductive portion and said protrusion portion with each other.

* * * * *